United States Patent [19]
Cotton et al.

[11] Patent Number: 5,908,812
[45] Date of Patent: Jun. 1, 1999

[54] STRUCTURE FOR HTS COMPOSITE CONDUCTORS AND THE MANUFACTURE OF SAME

[75] Inventors: James D. Cotton, Seattle, Wash.; Gilbert Neal Riley, Jr., Marlborough, Mass.

[73] Assignee: The Regents of the University of California, Los Alamos, N.M.

[21] Appl. No.: 08/597,061

[22] Filed: Feb. 5, 1996

[51] Int. Cl.$^6$ ............................ H01L 39/00; H01L 39/24; H01B 12/00
[52] U.S. Cl. ......................... 505/230; 505/231; 505/237; 505/238; 505/430; 505/704; 174/125.1; 29/599; 428/632; 428/701; 428/702; 428/930; 428/381; 428/384
[58] Field of Search ........................ 174/125.1; 29/599; 505/230, 231, 236, 237, 238, 240, 431, 432, 433, 434, 492, 501, 704, 740, 782; 428/629, 632, 209, 210, 332, 336, 378, 380, 381, 384, 689, 697, 699, 701, 702, 930

[56] References Cited

U.S. PATENT DOCUMENTS

| | | |
|---|---|---|
| 4,826,808 | 5/1989 | Yurek et al. .............................. 505/1 |
| 4,994,435 | 2/1991 | Shiga et al. ............................ 505/232 |
| 5,063,200 | 11/1991 | Okada et al. ........................... 505/230 |
| 5,100,481 | 3/1992 | Nakayama et al. ....................... 148/98 |
| 5,102,865 | 4/1992 | Woolf et al. ............................ 505/232 |
| 5,132,278 | 7/1992 | Stevens et al. ......................... 505/231 |
| 5,189,009 | 2/1993 | Yurek et al. .............................. 505/1 |
| 5,232,908 | 8/1993 | Shiga et al. ................................ 505/1 |
| 5,296,456 | 3/1994 | Shiga et al. ................................ 505/1 |
| 5,384,307 | 1/1995 | Lay ........................................ 505/430 |
| 5,424,282 | 6/1995 | Yamamoto et al. ..................... 505/433 |
| 5,583,094 | 12/1996 | Abe et al. .............................. 505/430 |

FOREIGN PATENT DOCUMENTS

| | | |
|---|---|---|
| 0380115 A2 | 8/1990 | European Pat. Off. . |
| 0638942 A1 | 2/1995 | European Pat. Off. . |
| WO9423459 | 10/1994 | WIPO . |

OTHER PUBLICATIONS

W.J. Carr, Jr. et al., "Interstrand eddy current losses in Rutherford cable", Cryogenics, 1995, vol. 35, No. 8, pp. 529–534.

Wei Gao et al., "Textured BSCCO/Ag superconducting microcomposites with improved critical current density through mechanical deformation" Supercond. Sci. Technol. 5 (1992) 318–326.

*Primary Examiner*—Marie Yamnitzky
*Attorney, Agent, or Firm*—Bruce H. Cottrell

[57] ABSTRACT

A superconducting oxide composite structure including a superconducting oxide member, a metal layer surrounding the superconducting oxide member, and an insulating layer of a complex oxide formed in situ adjacent to the superconducting oxide member and the metal layer is provided together with a method of forming such a superconducting oxide composite structure including encapsulating a superconducting oxide member or precursor within a metal matrix layer from the group of: (i) a reactive metal sheath adjacent to the superconducting oxide member or precursor, the reactive metal sheath surrounded by a second metal layer or (ii) an alloy containing a reactive metal; to form an intermediate product, and, heating the intermediate product at temperatures and for time sufficient to form an insulating layer of a complex oxide in situ, the insulating layer to the superconducting oxide member or precursor and the metal matrix layer.

9 Claims, 6 Drawing Sheets

Prior Art

007
STRUCTURE FOR HTS COMPOSITE CONDUCTORS AND THE MANUFACTURE OF SAME

This invention is the result of a contract with the Department of Energy (Contract No. W-7405-ENG-36).

FIELD OF THE INVENTION

The present invention relates to superconducting oxide articles, more particularly, to superconducting oxide articles having improved characteristics for alternating current operation, and to a method for the manufacture of the same.

BACKGROUND OF THE INVENTION

Since the discovery of the first oxide superconductors less than a decade ago, there has been great interest in developing high temperature superconducting conductors for use in high current applications such as power transmission cables, motors, magnets and energy storage devices. These applications will require wires and tapes with high engineering critical current densities, robust mechanical properties, and long lengths manufacturable at reasonable cost. Superconducting oxide materials alone do not possess the necessary mechanical properties, nor can they be produced efficiently in continuous long lengths. Superconducting oxides have complex, brittle, ceramic-like structures which cannot by themselves be drawn into wires or similar forms using conventional metal-processing methods. Moreover, they may be subject to a magnetic effect known as flux jumping which causes sudden localized temperature variations that can force them out of their superconducting state if it is not compensated. Consequently, the more useful forms of high temperature superconducting conductors usually are composite structures in which the superconducting oxides are supported by a matrix material which adds mechanical robustness to the composite and provides good thermal dissipation in the event of flux jumping. The matrix material chosen must be readily formable, have high thermal conductivity, and be sufficiently non-reactive with respect to the superconducting oxides under the conditions of manufacturing and use that the properties of the latter are not degraded in its presence. For composites made by the popular powder-in-tube or PIT process, described, for example, by Yurek et al. in U.S. Pat. Nos. 4,826,808 and 5,189,009, by Gao et al. in Superconducting Science and Technology, Vol. 5, pp. 318–326, 1992, by Rosner et al. in "Status of HTS superconductors: Progress in improving transport critical current densities in HTS Bi-2223 tapes and coils" (presented at the conference entitled 'Critical Currents in High Tc Superconductors', Vienna, Austria, April, 1992), and by Sandhage et al., "Critical Issues in the OPIT Processing of High Jc BSCCO Superconductors", in Journal of Metals, 43, 21, 1991, all of which are herein incorporated by reference, the matrix material must also provide sufficient oxygen access during manufacturing to allow the formation of a superconducting oxide from its precursor material. Very few matrix materials meet these requirements. Under normal manufacturing conditions, the original precursor mixture typically evolves to the final superconducting oxide, as well as some secondary phases, through a series of phase transformations which may take place at varying temperatures, pressures and oxidation conditions, and the phase transformations may indeed be optimized at somewhat different precursor stoichiometries from those needed to optimize the final superconductive oxide. An uncontrolled reaction between the precursor and the matrix during any one of these phase transformations can adversely affect the formation of the superconducting oxide. Because of this complex formation chemistry, it has frequently been preferred to minimize the potential for reactions between the matrix and the superconducting oxide or its precursors. Superconducting oxides have adverse reactions with nearly all metals except the noble metals. Thus, silver and other noble metals or noble metal alloys are typically used as matrix materials, and pure silver is the matrix material generally preferred for most high performance applications although composite matrices, including, for example, oxide diffusion barriers or silver layers between superconducting oxides and non-noble metals have been suggested in the prior art.

Many of the superconductor applications that have the greatest potential for energy conservation involve operating the superconductor in the presence of an alternating current (AC) magnetic field, or require that the superconductor carry an AC current. In the presence of time-varying magnetic fields or currents, there are a variety of mechanisms that give rise to energy dissipation, hereafter called AC losses, even in superconductors. Thus, the superconductor geometry must be selected to reduce AC losses, in order to preserve the intrinsic advantage of superconductors the absence of DC electrical resistance. The physics governing AC losses in low temperature superconducting composite materials have been described and analyzed, Wilson, Superconducting Magnets, Ch. 8 (1983,1990), and Carr, Jr., AC loss and Macroscopic Theory of Superconductors, Gordon and Breach Science Publishers, New York, 1983, and would be expected to operate in superconducting oxide composites with similar geometries. In general, the primary sources of AC loss are hysteretic loss within a superconducting filament or filaments, and eddy current loss in the matrix enhanced by coupling between superconducting filaments. To minimize hysteretic losses, the superconductor is preferably subseparated into many small filaments that are discrete and dimensionally uniform along the length of the conductor. Eddy current losses may be minimized by increasing the electrical resistivity of the matrix or by twisting the filaments, with tighter twist pitches providing lower losses. However, the inherent chemical and mechanical limitations of superconducting oxide composites limit the degree to which these approaches may be relied on for reducing AC losses in high temperature superconducting composites. Conventional methods for increasing the resistivity of the matrix have been limited. Silver, the matrix material of choice for these composites for the reasons discussed above, has a very low electrical resistivity. Efforts have been made to increase the resistivity of the matrix, for example, by distributing small amounts of simple oxide-forming metals in finely separated form in a silver matrix, and by using higher resistivity alloys to form all or part of the matrix adjacent to the filaments. However, the presence of even very small amounts of chemically reactive materials near the filament/matrix boundary during the manufacturing process can significantly degrade the properties of the superconducting oxide composite. This is a particularly delicate issue for composites consisting of many fine filaments as the higher surface to volume ratio greatly increases the risk of contamination. In the "PIT" manufacturing process, layers of high resistivity material can also block oxygen access to the filaments during manufacturing, inhibiting the formation of the superconducting oxide from its precursors. In addition, increasing the electrical resistivity of the matrix adjacent to the filaments, whether by surrounding the filaments with a resistive layer or by providing a uniformly doped matrix, generally decreases its thermal conductivity, increasing the risk of flux jumping during use.

U.S. Pat. No. 5,424,282 by Yamamoto et al. shows the formation of a simple oxide from a platinum-class element pipe such as platinum oxide produced by the heating of a platinum pipe and includes superconductive material therein adjacent to the simple oxide. U.S. patent application Ser. No. 08/444,564, filed May 19, 1995 by Snitchler et al. (abandoned in favor of Ser. No. 08/862,016, filed May 22, 1997) describes the in situ formation of insulating layers, but such insulating layers were not directly adjacent to the oxide superconductor filament or core. Neither of these efforts has achieved the results of the present invention.

It is an object of the present invention to provide multifilamentary superconducting composite articles in any desired aspect ratio with improved AC loss characteristics and high critical current densities, and a method for manufacturing them.

Another object of the present invention is to provide a method of reducing coupling losses in multifilamentary superconducting oxide composite articles without significantly increasing the risk of contamination of the superconducting filaments by the supporting matrix.

Still another object of this invention is to provide a method of manufacturing superconducting composite articles suitable for AC applications which provides adequate oxygen access for formation of a desired superconducting oxide with optimal current carrying capacity.

A further object of the present invention is to provide highly aspected multifilamentary BSCCO-2212 and BSCCO-2223 composite conductors having high current densities, superior AC loss characteristics and robust mechanical properties, and a method for producing them.

A still further object of the present invention to provide a method of mitigating filament coupling currents in multifilamentary high temperature superconducting (HTS) wires or tapes.

Yet another object of the present invention is to provide control or engineering of the composition of the superconductor material during processing by the encapsulating material around the superconductor material.

SUMMARY OF THE INVENTION

To achieve the foregoing and other objects, and in accordance with the purposes of the present invention, as embodied and broadly described herein, the present invention provides a superconducting oxide composite structure including a superconducting oxide member, a normal metal layer surrounding said superconducting oxide member, and an insulating layer of a complex oxide formed in situ adjacent to said superconducting oxide member and said normal metal layer.

The present invention further provides a method of forming a superconducting oxide composite structure including forming an intermediate product by encapsulating a superconducting oxide member or precursor within a metal matrix layer selected from the group consisting of: (i) a reactive metal sheath adjacent to said superconducting oxide member or precursor, said reactive metal sheath surrounded by a second metal layer or (ii) an alloy containing a reactive metal; and, heating said intermediate product at temperatures and for time sufficient to form an insulating layer of a complex oxide in situ, said insulating layer adjacent to said superconducting oxide member or precursor and said metal matrix layer.

The present invention still further provides a multifilamentary superconducting oxide composite structure characterized as substantially free of filament coupling losses.

DETAILED DESCRIPTION

The present invention is concerned with superconducting oxide articles and with a method for the manufacture of the same. The superconducting oxide articles have a generic N-I-S structure, i.e., a superconducting material (S) surrounded by an insulating material (I), with both the S and I surrounded by a normal metal material or matrix (N).

Figure 1:
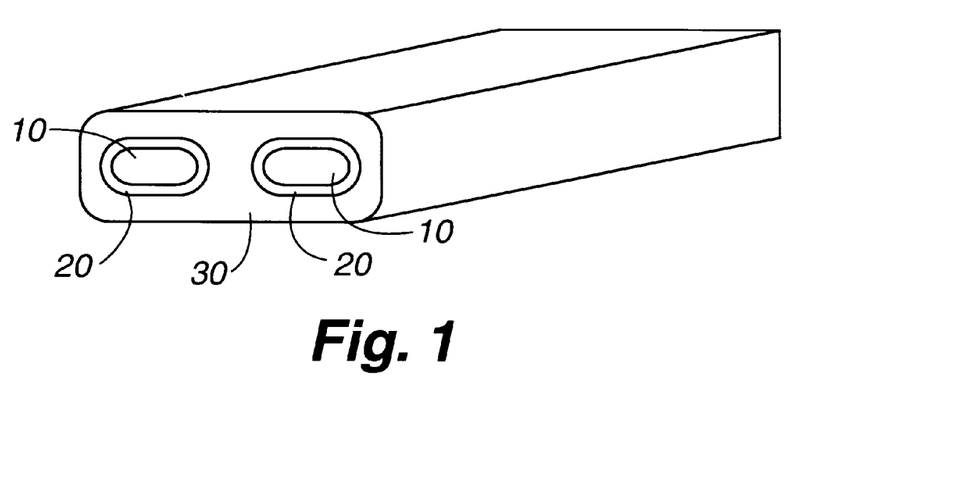
FIG. 1 is an embodiment of a strand containing two or more HTS filaments of the composite structure of the present invention.
Figure 2:
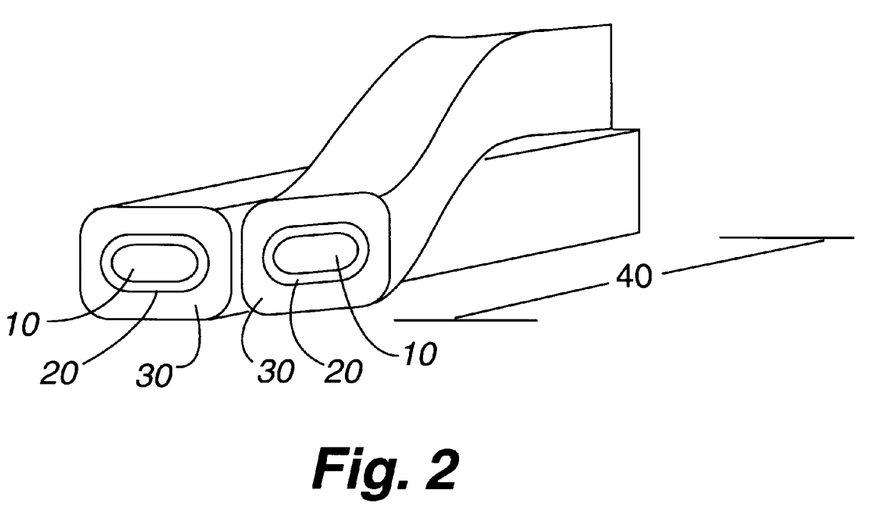
FIG. 2 is an embodiment of a cable containing two HTS monofilaments of the composite structure of the present invention.
Figure 3:
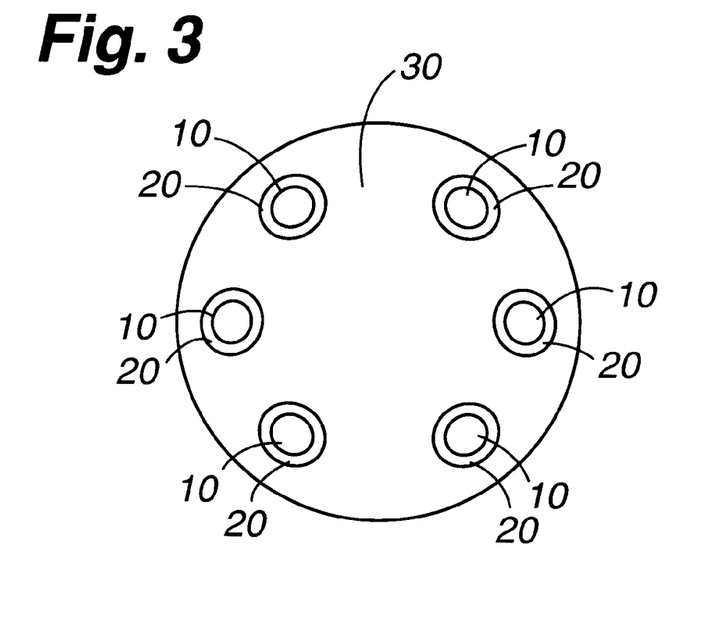
FIG. 3 is another geometry of a HTS structure containing multiple HTS filaments of the composite structure of the present invention.
Figure 4:
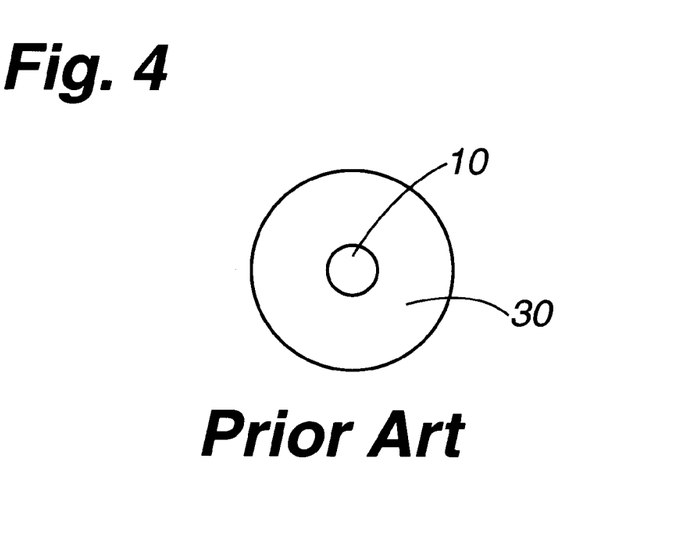
FIG. 4 shows a monofilament of a prior art N-S structure.

FIGS. 1–3 show various geometries of the N-I-S structure of the present invention with the superconducting cores or filaments (S) shown as 10, the insulating layers (I) shown as 20 and the normal metal layer (N) shown as 30. FIG. 4 shows a prior art comparative sample without an insulating layer between the superconducting core and normal metal layer. In FIG. 2, the individual filaments making up the cable are shown in a twisted arrangement with a twist pitch of distance 40.

By "matrix" as that term is used herein, is meant a material or homogeneous mixture of materials which supports or binds a substance, specifically including the filaments, disposed within or around the matrix. By "noble metal", as that term is used herein, is meant a metal which is substantially non-reactive with respect to oxide superconductors and precursors and to oxygen under the expected conditions (temperature, pressure, atmosphere) of manufacture and use. By "normal metal", as that term is used herein, is meant a metal which may be either noble metals or metals such as copper and the like which have metallic electrical properties, i.e., resistivities of $\leq 75$ microohm-centimeter ($\mu$ohm-cm) at operating temperatures. Noble metals are a subset of normal metals. The term "alloy" is used herein to mean an intimate mixture of substantially metallic phases or a solid solution of two or more elements. Silver and its alloys, including ODS silver, may be used.

By "complex oxide" as that term is used herein, is meant a multiple element oxide that can be either a phase such as, e.g., $CuAlO_4$, or a solid solution such as, e.g., $(Zr,Ca)O_2$. By the term "insulator" or "insulating layer" as used herein is meant materials with high resistivities ($\geq 75$ $\mu$ohm-cm) at operating temperatures of use for the final article. Complex oxides are generally a subset of insulators. In contrast to complex oxides, "simple oxide" is a term referring to single element oxides such as, e.g., PdO.

In a preferred embodiment, a conductive jacketing layer surrounds the article. Noble metals and alloys comprising noble metals, including ODS silver, are the most preferred jacketing layer materials, but other conductive materials, including composites of several different metals, may be used. Jacketing layers made from a material with a resistivity at least equal to that of the matrix materials, including composites of several different metals, may be used. Jacketing layers made from a material with a resistivity at least equal to that of the matrix material may be used, and jacketing layers with a resistivity on the order of about 0.5–75 μohm-cm are especially preferred.

By "desired oxide superconductor", as that term is used herein, is meant the oxide superconductor intended for eventual use in the finished article. Typically, the desired oxide superconductor is selected for its superior electrical properties, such as high critical temperature or critical current density. Members of the copper oxide based superconductors are preferred. By "precursor", as that term is used herein, is meant any material that can be converted to a desired oxide superconductor upon application of a suitable treatment, e.g., heat treatment. By "fine filaments" are meant filaments with a cross-sectional dimension less than 750 microns, and preferably less than 150 microns.

The invention may be practiced with any desired oxide superconductor or its precursors. Precursors may include any combination of elements, metal salts, oxides, suboxides, and/or oxide superconductors which are intermediate to the desired oxide superconductor, or other compounds which, when reacted in the presence of oxygen in the stability field of a desired oxide superconductor, produces that superconductor. For example, there may be included elements, salts, or oxides of copper, yttrium or other rare earths, and barium for the rare earth family of oxide superconductors; elements or oxides of copper, bismuth, strontium, and calcium, and optionally lead, for the BSCCO family of oxide superconductors; elements, salts, or oxides of copper, thallium, calcium and barium or strontium, and optionally, bismuth and lead, for the thallium (TBSCCO) family of oxide superconductors; elements, salts, or oxides of copper, mercury, calcium, barium or strontium, and optionally, bismuth and lead, for the mercury (HBSCCO) family of oxide superconductors. The bismuth and rare earth families of oxide superconductors are most preferred for operation of the invention. By "oxide superconductor intermediate to the desired oxide superconductor" is meant any oxide superconductor which is capable of being converted to the desired oxide superconductor. The formation of an intermediate may be desired in order to take advantage of desirable processing properties, for example, a micaceous structure, which may not be equally possessed by the desired superconducting oxide. Precursors are included in amounts sufficient to form an oxide superconductor. In some embodiments, the precursor powders may be provided in substantially stoichiometric proportion. In others, there may be a stoichiometric excess or deficiency of any precursor to accommodate the processing conditions used to form the desired superconducting composite. For this purpose, excess or deficiency of a particular precursor is defined by comparison to the ideal cation stoichiometry of the desired oxide superconductor. Thalliation, the addition of doping materials, including but not limited to the optional materials identified above, variations in proportions and such other variations in the precursors of the desired superconducting oxides as are well known in the art, are also within the scope and spirit of the invention.

The three-layer, high-Tc phase of a member of the BSCCO family of superconductors (BSCCO-2223), such as $Bi_2Sr_2Ca_2Cu_3O_x$ or $(Bi, Pb)_2Sr_2Ca_2Cu_3O_x$, is one of the desired superconducting oxides most preferred for the operation of the present invention. Composites including BSCCO-2223 have demonstrated the potential for superior mechanical and electrical performance at long lengths when adequately textured. The current-carrying capacity of a superconducting oxide composite depends significantly on the degree of crystallographic alignment and intergrain bonding of the oxide grains, together known as "texturing", induced during the composite manufacturing operation. For example, known techniques for texturing the two-layer and three-layer phases the bismuth-strontium-calcium-copper-oxide family of superconductors (BSCCO-2212 and BSCCO-2223, respectively) are described by Tenbrink et al. in Development of Technical High-Tc Superconductor Wires and Tapes, Paper MF-1, Applied Superconductivity Conference, Chicago (Aug. 23–28, 1992), and Motowidlo et al. in Mechanical and Electrical Properties of BSCCO Multifilament Tape Conductors, presented paper at the Materials Research Society Meeting (Apr. 12–15, 1993).

The highest reported performance for BSCCO-2223 multifilamentary composite conductors has been obtained in highly aspected forms containing flattened filaments with high aspect ratios. For untwisted or loosely twisted conductors, the AC losses typically measured as power per unit volume in a highly aspected tape are increased over the losses from a round wire of equal cross-sectional area by (to a zero order approximation) the square root of the tape's aspect ratio. Thus, a tape with a 9:1 aspect ratio will have about 81 times the losses of a round wire of equal cross-sectional area. The high aspect ratios of the flattened filaments also cause increased hysteretic losses in transverse magnetic fields. If, as is typical, the tape is obtained by deforming a round billet, filaments of equal dimension will also be non-uniformly flattened by the texturing process, with significantly greater flattening and deformation induced texturing (DIT) of filaments at the center of the tape than of filaments at the periphery of the tape and non-uniform distances between filaments causing undesirable asymmetries in current carrying capability and additional AC loss effects.

Previously, it has been found that the division of the matrix into a plurality of substantially electrically decoupled domains substantially improves the AC loss characteristics of the superconducting composite article. The effect is particularly pronounced for highly aspected superconducting oxide composites, which have large eddy current coupling losses when exposed to changing magnetic fields normal to their wide faces. It is believed that, by analogy to Carr's anisotropic continuum model for losses in a multistrand Rutherford cable, Carr, Jr. et al., "Interstrand eddy current losses in SSC magnets," Cryogenics, submitted 1994, such losses in the filament/matrix region of an aspected superconducting composite composed of multiple domains can be approximated by a term representing the normal conductance between adjacent filaments within a domain $(1+[L^2/_4w^2]) B_{perp}^2 w^2 12 p_n$ plus a term representing the coupling losses along the domain boundaries $B_{perp}^2 L^2 B^2 w^2/64 d^2 p_{perp}$. In addition, the conductive jacket will have standard eddy current losses, which can be approximated by $P_j \sim B_{perp}^{2wv2}/2pd$ when the thickness of the jacketing layer is much smaller than the strand dimensions. If the layer separating adjacent domains is an insulator whose resistivity far exceeds the resistivity within the domain, $P_{perp}$ will be very low in comparison to $P_n$, or $P_j$ and may be ignored. If one surface of the domain is bounded by a portion of the jacketing layer, then in the simplest case where only one filament is found in each domain, the normal coupling $P_n$ will take place through the jacketing layer rather than through the filament decoupling layers, and may be represented by $(1+[L^2/_4w^2])B_{perp}^2vw^2/6dp_m$. This simplified case will be approximated whenever there are relatively few filaments per domain and the filament decoupling layers have a resistivity at least 100 times greater than that of the matrix. Thus, selective use of discrete filament decoupling layers made from insulating materials to establish substantially electrically isolated domains significantly improves the AC loss characteristics of the multifilamentary composite such that losses only go proportional to frequency (f) through substantial reduction of filament coupling losses proportional to the square of the frequency ($f^2$). Complete elimination of filament coupling losses would be highly desirable but the prior art has not thus far achieved this. This results from the dominant mechanism determining overall AC loss behavior in the absence of sheath eddy current losses. Thus, the composites of the present invention will have losses that are linear with respect to frequency up to a crossover frequency determined by eddy current losses of the sheath. Calculations for a cylindrical multifilamentary conductor indicate that the lower bound of this crossover for a fully penetrated sinusoidal time varying magnetic field will be given by the equation:

$$f_m = 12\rho_m J_c dB_m/\pi^2\beta^2 \text{ with } \beta^2 = ((aB_{m\perp a})^2 + (bB_{m\perp b})^2)$$

where $\rho_m$ is the resistivity of the N layer;

$J_c$ is the critical current density;

$B_m$ is the peak magnetic field amplitude;

d is the filament dimension transverse to the magnetic field;

$B_{m\perp a}$ is the field component perpendicular to conductor's narrow surface of thickness a; and, $B_{m\perp b}$ is the field component perpendicular to conductor's broad surface of width b. Note that predicted crossover is valid for fully successful multifilament (or strand) N-I-S structures. Partial success, i.e., a somewhat discontinuous I layer, can also provide AC loss benefits by increasing the frequency crossover from hysteresis to filament coupling given in the case of no I layer in a cylindrical multifilamentary conductor for a fully penetrated triangular wave function by the equation:

$$f_n = 2\pi^2 J_c d\rho_m/B_m 1_p^2$$

where $1_p$ is the twist pitch.

Resultant effects of the N-I-S structures of the present invention thus include the suppression and most preferably the elimination of filament coupling losses resulting in the following measured effects in multifilamentary or multistrand composites: a volume normalized power loss that is linear with frequency above the level predicted by $f_n$ to a maximum possible level predicted by $f_m$; and, the inability to measure superconductivity using a transport technique applied to the N layer and a low voltage criterion, e.g., 1 $\mu$V/cm, across short, e.g., 1 cm, lengths of conductor.

The N-I-S structures of the present invention can be formed from two initial starting materials by encapsulating a desired oxide superconductor or precursor within a metal alloy including at least one alloy component capable of reacting with one or more components of the desired oxide superconductor or precursor to form a multicomponent or complex oxide insulating layer.

Suitable metal alloys include at least one alloy component capable of reacting with one or more components of the desired oxide superconductor or precursor. Through the use of the Pilling-Bedworth ratio (see Fontana et al., Corrosion Engineering, 2nd Ed., pp. 347–349, (1978)), a simple materials criteria for the reactive metal selection can be achieved. The Pilling-Bedworth ratio is expressed as R=Wd/Dw where W is the molecular weight of the oxide, d is the specific density of the reactive metal, D is the specific density of the oxide, and w is the atomic weight of the reactive metal. To achieve a low volume change during reaction, a value of R of about one (1) is desired. There may, however, be benefits to placing the ceramic filament in compression such that R values of up to two (2) can be considered reasonable. Thus, metals with R values of from about 1 to about 2 are generally desired. Such metals include beryllium, copper, aluminum, silicon, chromium, manganese, iron, cobalt, nickel, palladium, cerium, lead, cadmium, platinum and titanium. Of these reactive metals, the most preferred for reaction with the desired oxide superconductor are palladium, aluminum, copper, titanium, lead and silicon. In addition, although its R value is only about 0.8, it is believed that magnesium can also be a viable reactive metal because its activity is so high with respect to many other metals. Alloys of silver are preferred and alloys of silver and palladium are especially preferred. Typically, the silver content of such alloys is from about 40 to 95 atomic percent, preferably from about 60 to 90 atomic percent.

For the case of a reactive alloy precursor structure to the N-I-S structure with a complex oxide insulating layer, there are two criteria for appropriate materials selection. One criterion is based on the Pilling-Bedworth ratio of a metal as discussed above. This criterion is important to provide for a substantially continuous insulating layer formation. The other criterion is related to the respective activity of the alloy components (or elements). This criterion is important to achieve sufficient relative mass transport of the components of the alloy, and resulting complex oxide layer formation.

For successful complex oxide formation adjacent to the superconductor and normal metal layers, one component of the alloy must have a higher effective activity than the other and the more active of the must have a Pilling-Bedworth ratio between about 1 and 2. A higher effective activity can be defined with respect to either (i) a higher oxygen affinity as determined by the free energy of oxide formation or (ii) a lower free energy of complex oxide phase formation or both (i) and (ii). In addition, if an alloy component is also a component of the superconductor, then the relative activity of that component is decreased. Note that non-noble metals have higher effective activities than do noble metals. It is generally known that systems undergoing chemical reaction, as in the case of complex oxide formation, are driven to minimize their overall free energy. As a result, the formation of complex oxides from components with higher activities is favored. Because mass transport of chemically active components is proportional to the activity gradient, the relative mass transport of alloy components with higher effective activities to the region of complex oxide formation will generally be greater than that of alloy components with lower effective activities. Examples of alloy systems that satisfy this criterion with respect to complex oxide formation in N-I-S structures are: Ag—Pd (Pd is more active), Cu—Al (Al is more active), Au—Pt (Pt is more active).

The N layer of the N-I-S structure is generally substantially oxygen permeable so that the S layer or S filaments can properly form. While the N layer is typically noble in that it does not react with or contaminate the S layer, there may be instances where the insulating layer (I) has an oxidation rate sufficiently rapid in relation to that of the S layer or filament(s) (or where the I layer oxidizes at a lower temperature than the S layer such that a ramped reaction can be carried out) and the resultant insulating layer of a complex oxide is substantially impermeable to any N layer metal cations but permeable to oxygen, then the N layer metal can be an non-noble metal such as copper and the like.

The insulating layer of a complex (multicomponent) oxide is typically formed from a combination reaction between the reactive metal layer or the reactive metal component of a suitable metal alloy and one or more components of the desired oxide superconductor or precursor in addition to oxygen. The complex oxide can typically include multiple phases of materials. Exemplary oxide phases that may form during reaction between BSCCO and the various reactive metals include calcium oxide phases such as $Ca_2SiO_4$, $Ca_2PbO_4$, $CaAl_2O_4$, $Ca_3Ti_2O_7$, and $Ca_2CuO_3$, copper oxide phases such as $CuAl_2O_4$, and $CuFe_2O_4$, and lead phases such as $PbTiO_3$ and $PbAlO_4$. The insulating layer can generally be of a thickness from about 0.02 microns to about 20 microns, preferably from about 0.5 to about 5 microns.

One major benefit of the complex oxide formation disclosed here is the ability to modify the effective chemical composition in the superconducting filament. It is well known that to achieve the highest levels of superconducting performance that the HTS grains must be highly textured and dense, with no secondary phase formation. However, it has been very difficult with current processes to simultaneously achieve high texture and density and also achieve no secondary phases in the product material. Specifically, it is generally known that high performance can be achieved in the Bi-2223 system using a reactive mixture of Bi-2212 and secondary phases. In addition, the highest performance for Bi-2223 has been achieved with overall stoichiometries that have excess copper. Excessive copper during the reaction of the Bi-2212 and secondary phases is necessary to achieve the complete and uniform transformation of Bi-2223. This result is completely consistent with Le Chatelier's principal of chemical reaction, which states that reactions are driven in directions determined by the overall chemistry of the system. In this case, Bi-2223 is richer in copper than is Bi-2212 and copper in excess of that necessary to form Bi-2223 has been found to drive the chemical reaction to a more complete end result. However, the problem with current processing paradigms is that the excess copper remains within the superconductor as a secondary phase (typically CuO or alkaline earth cuprate, e.g., $(Ca,Sr)_2CuO_y$ or $(Ca,Sr)_4Cu_2O_x$). By occluding supercurrent, the presence of these secondary phases in the superconductor is detrimental to the properties of the article. Because the present invention provides a means to alter the overall composition (or stoichiometry) of the superconductor, for the first time the benefits of excess copper during the chemical reaction can be realized and yet eliminate the excess copper through formation of a complex oxide layer that has copper as a component so that the final product has improved performance. Although the specific description here has focused on copper, other situations will be apparent including lead modifications the complex oxide can have lead solubility such that lead levels can be sufficiently high early in the BSCCO-2223 formation to allow for any necessary liquid flux needed for desirable superconductor phase development with the lead then being soluble in the complex oxide thereby minimizing any undesirable lead phases within the S layer. Generally, the formation of a desired oxide superconductor from its precursors and/or intermediate precursors results from a series of phase transformations and modifications, each of which may be beneficially stimulated by excess concentrations of components of the superconductor than is desired in the final product to achieve the highest desired performance.

It is important to recognize that the stoichiometry modifications disclosed herein do not necessarily require the formation of a substantially continuous complex oxide layer. In an alternative embodiment, the complex oxide formation can occur at the boundary between a noble metal layer and the superconductor layer on a length scale that is on the order of the minimum superconductor layer dimension. That is, if the minimum superconductor dimension is on the order of 10 microns then the areas of complex oxide formation can be discontinuous on a length scale of about 10 microns.

While not wishing to be bound by this explanation, this formation of a complex oxide is believed to include additional benefits such as: slower reaction kinetics allowing more control of the insulating (I) layer; the potential for control or engineering of mechanical and electrical properties as complex oxides tend to have more uniform deformation thereby distributing macroscopic strain more uniformly and as doping of simple oxides can lead to broad ranges of electrical resistivity such self-doping complex oxides can have tailored resistivities; and oxygen exchange with the superconductor filament as is the case for calcium-stabilized zirconia.

Because components of S and maybe I are present in I, the chemical behavior of the I layer will be chemically passive towards the S layer and can be passive towards the N layer. Further, the cationic composition of the oxide superconductor can be altered in a controllable fashion during the heat treatment of a pre-selected N-I-S precursor assembly, i.e., the chemistry of the closed system may be controlled or engineered. For example, this control may lead to the achievement of desired microstructures for optimum performance of the oxide superconductor composite where an off-stoichiometric partial melt is necessary for optimal grain growth and texture, but an on-stoichiometric final material is necessary for optimum superconducting performance. The use of the in-situ formation of the I layer to switch the composition from off-stoichiometric to on-stoichiometric by reaction with one or more components of the S layer can be critical. In another fashion, slow growth of the insulating (I) layer may help place the S layer into a more favorable compressive state when the respective molar volume of a mutual component is larger in the insulating layer than the S layer.

In another embodiment of forming the N-I-S structures of the present invention, three initial starting materials can be employed. A desired oxide superconductor or precursor can be encapsulated with a first metal, which is then encapsulated by a second metal, the first metal capable of reacting with one or more components of the desired oxide superconductor or precursor to form a complex oxide insulating layer. The first metal can further be capable of reaction with the second metal to form a layer of an alloy and/or a complex oxide around the insulating layer.

Where the N-I-S structures are formed from three initial starting materials, the first metal directly contacting the superconducting oxide material can be selected from among the reactive metals described above including beryllium, copper, aluminum, silicon, chromium, manganese, iron, cobalt, nickel, palladium, cerium, lead, cadmium, titanium and magnesium. Palladium is especially preferred as the reactive metal. The second normal metal is most preferably silver, but non-noble metals and alloys may be used also. The criteria for this is only the Pilling-Bedworth ratio due to physical separation of the N and S layers by the I layer precursor, i.e., the reactive metal layer.

The present invention is more particularly described in the following examples which are intended as illustrative only, since numerous modifications and variations will be apparent to those skilled in the art.

EXAMPLE 1

Starting materials of the following purities were obtained: silver rod (from Handy & Harmon; 4N), manganese pieces (from Aesar; 4N), palladium rod and platinum sheet. Several alloys were produced by arc melting of the constituent pieces. Charges for arc melting of each of the constituent pieces were weighed to the nearest milligram to produce buttons weighing 15 g each and arc melted under argon gas. Each resultant button was inverted and remelted three times to promote homogeneity. The buttons were generally of a shiny appearance with the exception of some loose smut on a few which was easily removed. Weight losses during melting were typically two percent. The resulting buttons were initially homogenized for 68 hours in vacuum at 900° C. However, this lead to considerable sublimation losses, in some cases up to 63%. Therefore, the alloys were recast and not homogenized prior to further processing.

Each of the buttons, which were approximately 0.25" thick, were cold-rolled by multiple passes of 0.005" or 0.010" to a final thickness of 0.025"±0.003". A small number of passes were conducted at an orientation 90 degrees to the primary rolling direction to increase the width of the resulting sheet. Cold rolling to this thickness was without difficulty.

The rolled sheets were sheared into two pieces, of which one was subjected to a simulated reaction/sinter (oxidation) treatment. This was conducted by placing the sheet specimens on an alumina plate in a three-zone furnace, flowing 10% oxygen-90% argon across the specimens, and heating to 830° C. for 48 hours. Both heating and cooling occurred over a six hour period. Vickers microhardness of each of the conditions was measured at 50 grams load by typically seven indentations. Indentations which were obviously affected by porosity were ignored.

The electrical resistivity of the as-rolled and oxidized conditions was measured by the four-probe technique on wires of approximately square cross-section which were sheared from each specimen condition. All wires were sheared such that the direction of current flow coincided with the principal rolling direction of the sheet. Measurements were then conducted at both ambient and liquid nitrogen temperatures and are shown in Table 1.

TABLE 1

Electrical Resistivities of Ag Alloys ($\mu\Omega$-cm)

| Alloy (atomic %) | As-Rolled | | Oxidized | |
| --- | --- | --- | --- | --- |
| | 300 K | 75 K | 300 K | 75 K |
| pure Ag | 1.4 | 0.3 | 1.2 | 0.2 |
| Ag-15 Pd | 12 | 10 | 10 | 7.6 |
| Ag-30 Pd | 16 | 14 | 18 | 16 |

Alloy/Bi-2223 compatibility experiments were conducted by dispersing a small amount of Bi-2223 precursor powder in isopropyl alcohol (50/50 by volume) on 1 centimeter by 2 centimeter sheets of the alloys. After air drying, the specimens were reacted in 10% oxygen at 830° C. and 48 hours and removed from the furnace. All alloy and compatibility samples were metallographically sectioned in both the as-rolled and oxidized conditions through the plane normal to the rolling direction. Light optical and scanning electron photomicrographs (SEM) were recorded. Energy dispersive spectrometry (EDS) and electron microprobe analysis (EMPA) were utilized to determine the extent of segregation and characterize the phases present.

Figure 6A:
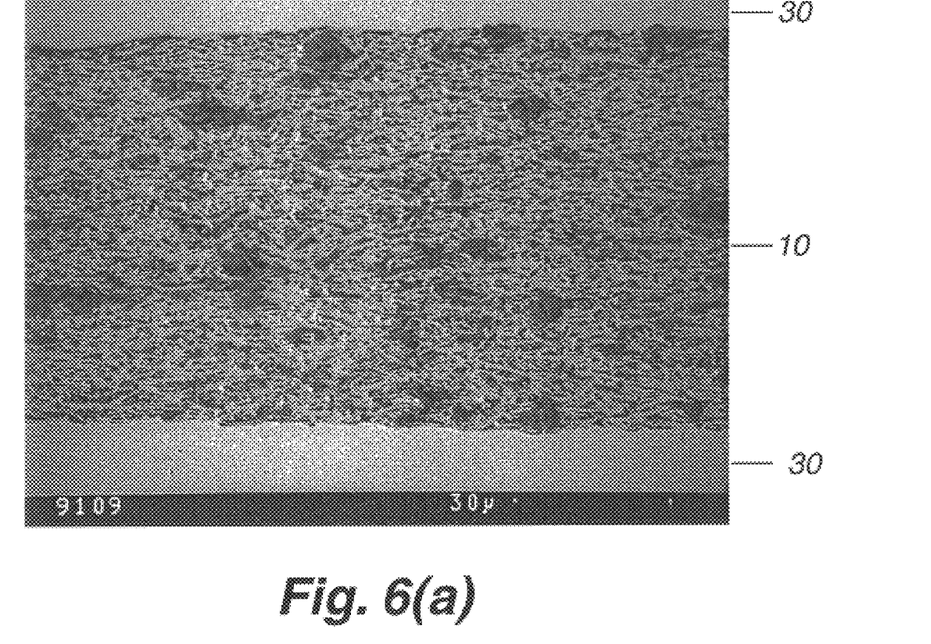
FIGS. 6(a) and 6(b) are backscattered electron micrographs of: (a) a Ag/BSCCO-2223 filament cross-section; and, (b) a Ag-20Pd/BSCCO-2223 filament cross-section.
Figure 6B:
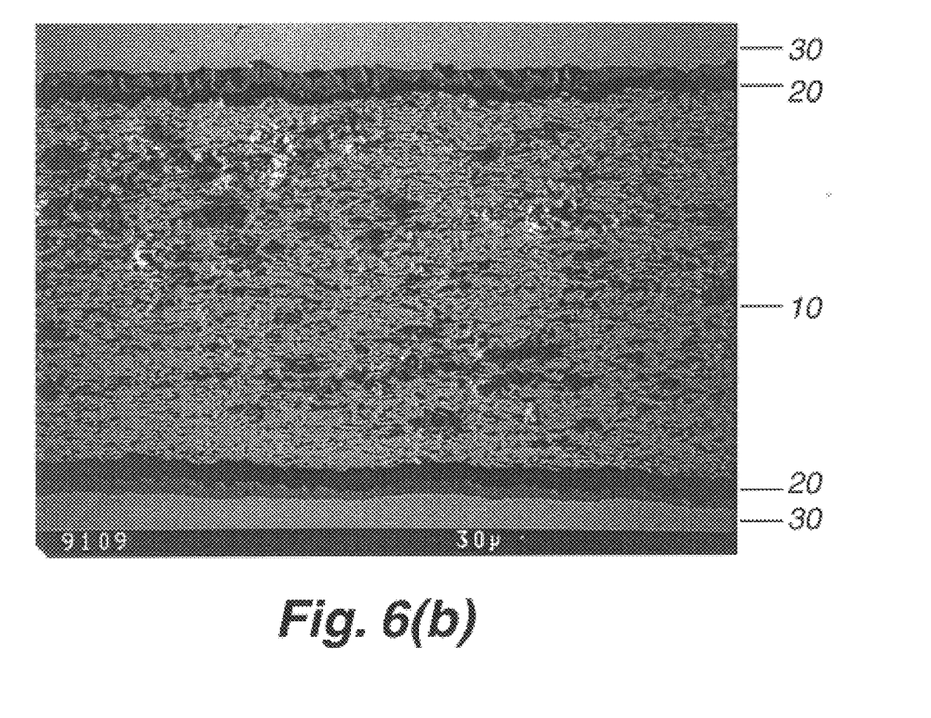

Based on this data, monofilament tapes were produced for a silver-20 atomic percent palladium alloy sheath, along with a pure silver control sheath as a control. This alloy was designed to have an electrical resistivity of 10 $\mu\Omega$-cm at ambient conditions. An arc-melted casting was produced from the above starting materials. The casting was remelted several times prior to final casting into a finger-shaped mold, and weighed 141.6 grams (g) (28.0 g Pd; 113.6 g Ag). This size was chosen to result in a swageable cylinder approximately 10 cm×1.25 cm diameter. Both the silver-palladium casting and the 4N silver rod were swaged to a uniform round cross section of approximately 0.71 cm diameter and gun-drilled to produce a tube. Both tubes were loaded with Bi-2223 powder, and processes by standard methods to produce tapes approximately 0.02 cm thick and 0.23 cm wide. Short lengths of each were processed at 810° C. (#1) and 827° C. (#2) for 48 hours in about 0.075 atmospheres (atm) of oxygen to convert the core to the Bi-2223 phase. Standard methods were utilized to characterize each tape for $J_c$, $T_c$ and microstructure. EDS analysis indicated the presence of Bi-2212 phase in the oxide layer on the silver-palladium alloys and indicated the superconductor filaments were surrounded by a substantially continuous layer of a complex oxide indicated to be a $(Pd,Cu)_3(Ca,Sr)O_4$ by analysis. FIGS. 6(a) and 6(b) show backscattered electron micrographs of cross sections of both a Ag/BSCCO-2223 filament (FIG. 6(a)) and a Ag-20Pd/BSCCO-2223 filament having a layer of complex oxide present (FIG. 6(b)).

Figure 7A:
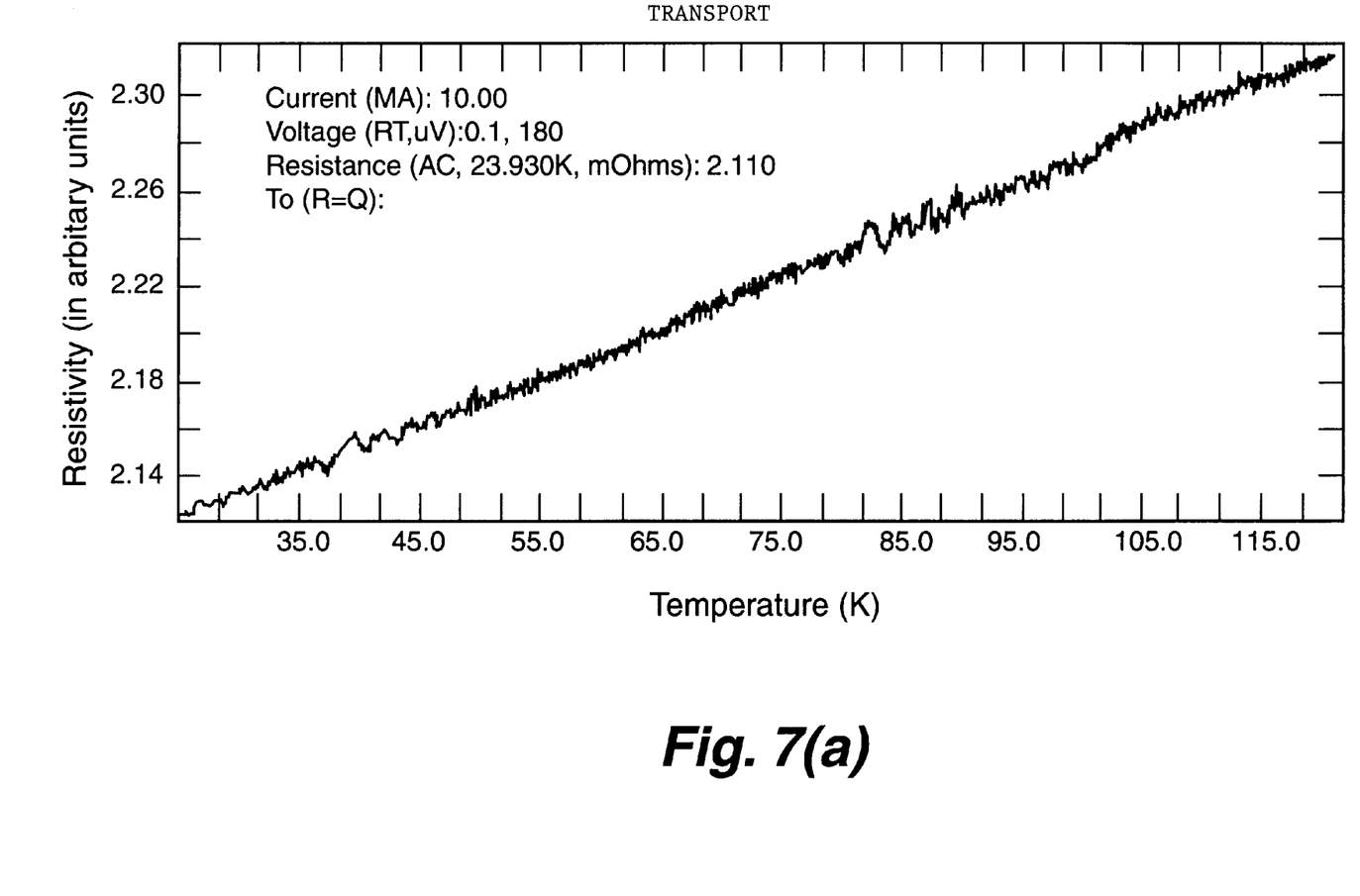
FIGS. 7(a) and 7(b) are plots of transport and AC susceptibility for a composite structure of the present invention.
Figure 7B:
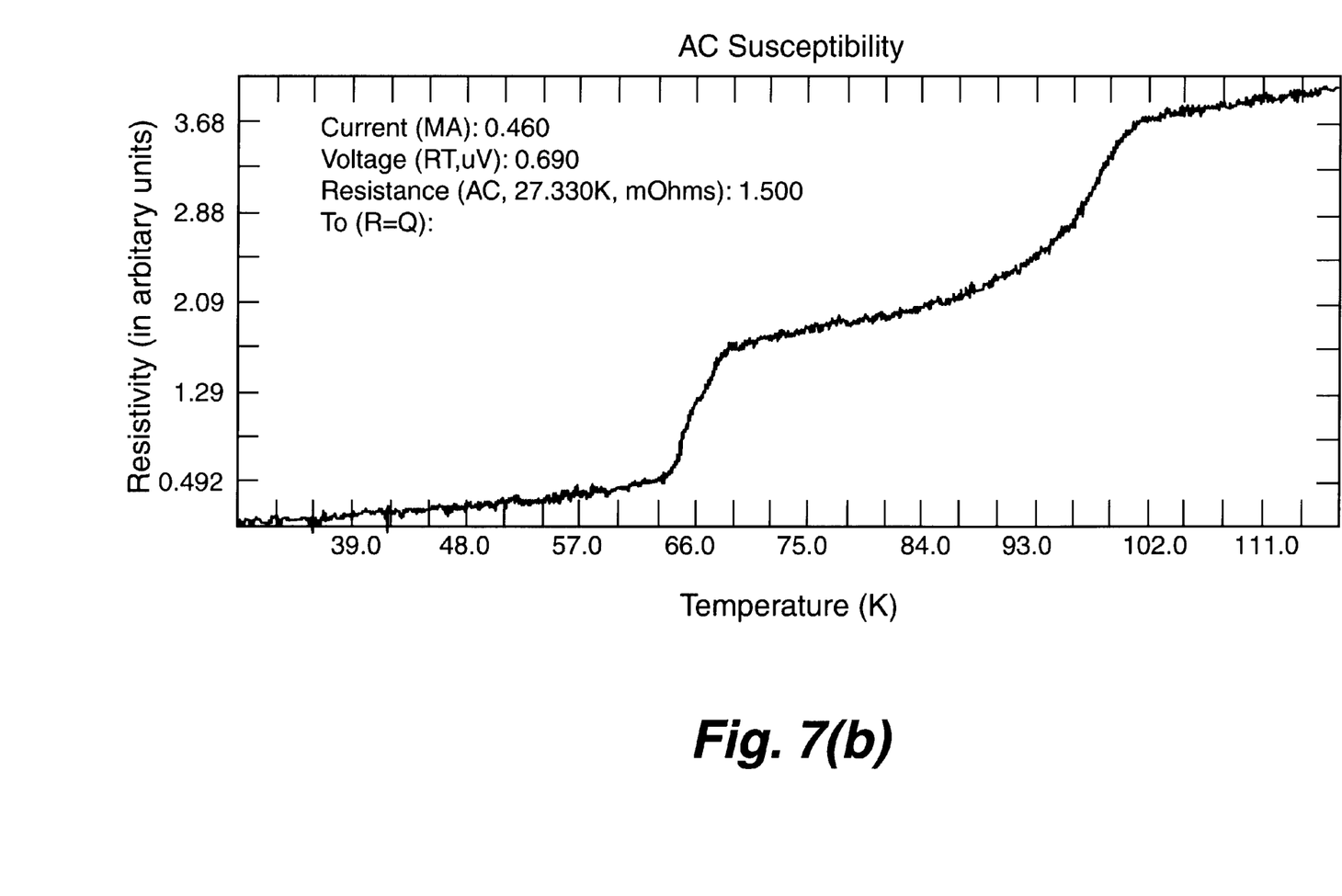

The electrical and superconducting properties of these articles were characterized in the following ways. Standard four point contact transport techniques were used to measure the resistivity of the normal metal matrix and in an attempt to measure the superconducting properties, $T_c$ and $I_c$. In addition, a standard AC susceptibility technique was used to measure the superconducting properties (relative magnetization and $T_c$) in a non-contact, non-transport manner. The resistivities of the normal metal materials, as shown in Table 2, were consistent with predicted values from previous studies. A subset of the superconducting properties are provided in another Table. FIGS. 7(a) and 7(b) show transport and AC susceptibility behavior of N-I-S structures and demonstrate the effectiveness of a barrier (I) to electrical current between an N layer and S.

TABLE 2

Electrical Resistivities of Ag/Bi-2223 and Ag-20 Pd/Bi-2223 Tapes ($\mu\Omega$-cm)

| Sheath | 300 K | 75 K |
| --- | --- | --- |
| Ag control | 2.0 | 0.34 |
| Ag control | 2.0 | — |
| Ag-20 Pd | 11.9 | 10.1 |
| Ag-20 Pd | 8.0 | — |

TABLE 3

Superconducting properties of
Ag and Ag-20 atomic % Pd Bi-2223 monofilaments

| Tape (heat treatment) | $T_c$ by AC susceptibility (K) | Transport $I_c$ at 77 K (A) |
| --- | --- | --- |
| Ag (#1) | 108.5 | 7.6 |
| Ag (#2) | 109.0 | 18.0 |
| Ag-20 Pd (#1) | 70 | 0 |
| Ag-20 Pd (#2) | <40 | 0 |

EXAMPLE 2

In an effort to more closely control the extent of the interfacial reaction which forms the insulating phase, the amount of reacting element, palladium, may be restricted. This may be accomplished by lining a conventional Ag PIT tube, 0.635 cm outer diameter and 0.397 cm inner diameter, with 0.0025 cm thick pure palladium foil. The palladium foil was sized such that only a slight overlap of the foil edges was permitted along the tube length. The tube was then manually loaded with BSCCO-2223 precursor powder, electron-beam welded shut with a pure silver plug, and mechanically processed to 1.01 cm outer diameter by progressive cold drawing. It was then cold rolled to 0.0157 cm thick tape. Following cold rolling, metallographic examination indicated the final palladium layer was approximately 0.001 cm thick.

Heat treatments of several identical tape sections were conducted at 550° C., 600° C., 650° C., 700° C., 750° C., 800° C. and 810° C. for 24 hours in 10 percent oxygen, with a ramp rate of 10° C. per minute. AC susceptibility measurements for the latter two indicated $T_c$'s of 105K and 65K, respectively. These experiments suggest that this approach is viable for production of an electrically resistive or insulating layer surrounding and in intimate contact with each superconducting BSCCO filament.

EXAMPLE 3

A copper-aluminum alloy and fine-silver rod are gun-drilled in a 7 filament configuration. BSCCO-2223 precursor powders are packed into the filament holes. The resulting article is drawn to a wire diameter of about 0.050 inch. The article is then twisted to a filament twist pitch of about 0.3 inch and heat treated according to the process of Example 1. The heat treatment will result in the formation of a $CuAl_2O_4$ phase adjacent to the superconducting and normal metal layers in the copper-aluminum composite (N-I-S). The electrical properties are measurable using techniques described in Example 1.

Figure 5A:
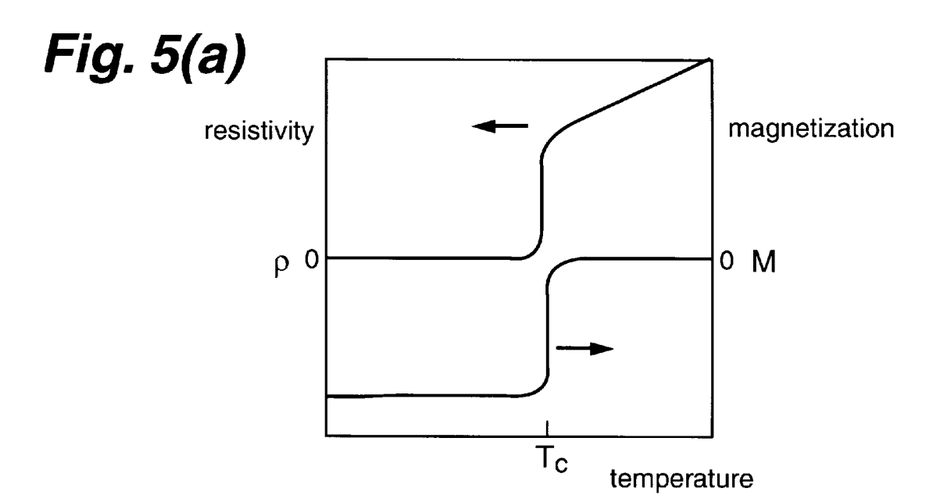
FIGS. 5(a) and 5(b) are graphs showing resistivity (on the left y-axis) versus temperature and magnetization (on the right y-axis) versus temperature for a comparative example with no insulating layer of complex oxide and for a sample of the present invention, respectively.
Figure 5B:
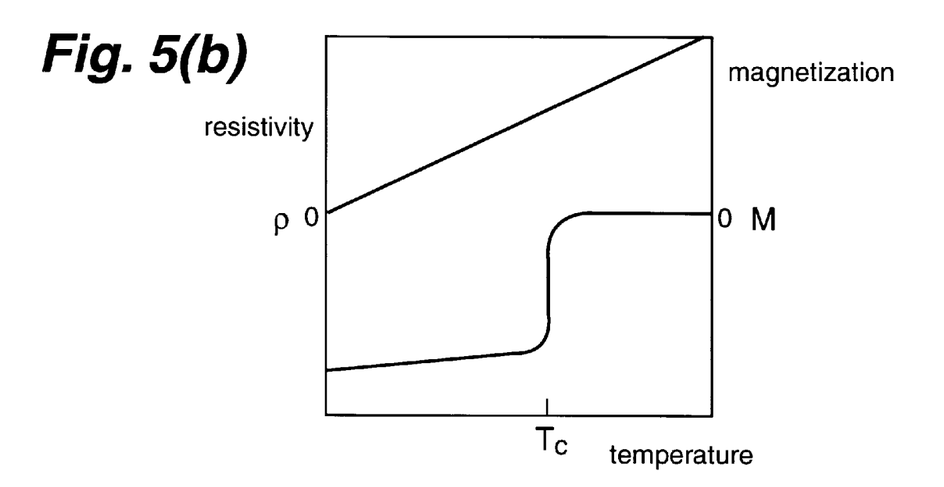

FIGS. 5(a) and 5(b) provide a summary of the principal benefits of this invention. The resistivity and magnetization versus temperature behavior of an article that does not have a complex oxide N-I-S structure (FIG. 5(a)) reveals that both the resistivity and the magnetization of the article decrease dramatically at the transition temperature, $T_c$. In contrast, the resistivity and magnetization versus temperature behavior of an article that does have a complex oxide N-I-S structure (FIG. 5(b)) reveals that only the magnetization of the article decreases dramatically at the transition temperature, $T_c$. The resistivity versus temperature behavior is characteristic of a normal metal, demonstrating that no transport current is reaching the superconducting material that is separated from the normal metal by the complex oxide insulating layer.

This result means that filament coupling currents that would exist in the AC operation of a conventional multifilamentary article with essential behavior such as shown in FIG. 5(a) would not exist in the AC operation of a multifilamentary article that benefits from a N-I-S structure taught here with essential behavior such as shown in FIG. 5(b). As a result, the AC losses of the N-I-S based article would be less than those of a conventional article.

Although the present invention has been described with reference to specific details, it is not intended that such details should be regarded as limitations upon the scope of the invention, except as and to the extent that they are included in the accompanying claims.

What is claimed is:

1. A superconducting oxide composite including a superconductive oxide, a normal metal surrounding said superconductive oxide and a layer of a complex oxide between said superconductive oxide and said normal metal, said composite characterized as having no resistive measure of superconductivity when a pair of contacts are applied to a surface of said composite at a distance apart of at least 1 centimeter.

2. A superconducting oxide composite structure comprising:
   a superconducting oxide member;
   a normal metal layer surrounding said superconducting oxide member; and
   an insulating layer of a complex oxide formed in situ between said superconducting oxide member and said normal metal layer, said superconducting oxide composite structure further characterized as having no resistive measure of superconductivity when a pair of contacts are applied to a surface of said composite at a distance apart of at least 1 centimeter.

3. A superconducting oxide composite structure comprising:
   a superconducting oxide member;
   a normal metal layer surrounding said superconducting oxide member; and
   an insulating layer of a complex oxide formed in situ between said superconducting oxide member and said normal metal layer, wherein at least one component of said normal metal layer is silver or a silver alloy.

4. A superconducting oxide composite structure comprising:
   a superconducting oxide member of a bismuth-strontium-calcium-copper oxide;
   a normal metal layer surrounding said superconducting oxide member; and
   an insulating layer of a complex oxide formed in situ between said superconducting oxide member and said normal metal layer.

5. The superconducting oxide composite structure of claim 4 wherein said normal metal layer is a silver-palladium alloy.

6. The superconducting oxide composite structure of claim 5 wherein said complex oxide insulating layer is a palladium-strontium-calcium-copper oxide.

7. The superconducting oxide composite structure of claim 4 wherein said complex oxide insulating layer includes a metal having a Pilling-Bedworth ratio of from about 1 to about 2 and at least one component of said complex oxide insulating layer is palladium.

8. A superconducting oxide precursor composite structure comprising:
   a superconducting oxide precursor;
   a reactive metal layer adjacent to said superconducting oxide precursor, said reactive metal having a Pilling-Bedworth ratio of from about 1 to about 2; and, a normal metal layer surrounding and adjacent to said reactive metal layer, said precursor composite structure further characterized in that said reactive metal layer and components of said superconducting oxide precursor are capable of reacting at processing conditions for formation of a superconducting oxide from said superconducting oxide precursor whereby an insulating layer of a complex oxide is formed in situ between said superconducting oxide member and said normal metal layer.

9. A method of forming a superconducting oxide composite structure comprising:

forming an intermediate product by encapsulating a superconducting oxide member or precursor within a normal metal matrix layer of a reactive metal sheath adjacent to said superconducting oxide member or precursor, said reactive metal sheath surrounded by a second metal layer; and, reacting said intermediate product at temperatures and for time sufficient to form an insulating layer of a complex oxide in situ, said insulating layer between said superconducting oxide member or precursor and said normal metal matrix layer, wherein said insulating layer of a complex oxide is formed from at least one component of said superconducting oxide member or precursor and from said reactive metal sheath adjacent to said superconducting oxide member or precursor, said reactive metal sheath being surrounded by a second metal layer.

* * * * *